US011195966B2

(12) United States Patent
Smith et al.

(10) Patent No.: US 11,195,966 B2
(45) Date of Patent: Dec. 7, 2021

(54) BIFACIAL SOLAR CELLS WITH REFLECTIVE BACK CONTACTS

(71) Applicant: SUNPOWER CORPORATION, San Jose, CA (US)

(72) Inventors: David D. Smith, Campbell, CA (US); Sung Dug Kim, Pleasanton, CA (US); Joseph Behnke, San Jose, CA (US); Hung-Ming Wang, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/852,315

(22) Filed: Sep. 11, 2015

(65) Prior Publication Data

US 2017/0077336 A1 Mar. 16, 2017

(51) Int. Cl.
| | |
|---|---|
| *H01L 31/054* | (2014.01) |
| *H01L 31/048* | (2014.01) |
| *H01L 31/0236* | (2006.01) |
| *H01L 31/0224* | (2006.01) |
| *H01L 31/068* | (2012.01) |
| *H01L 31/18* | (2006.01) |

(52) U.S. Cl.
CPC .... *H01L 31/0547* (2014.12); *H01L 31/02366* (2013.01); *H01L 31/022441* (2013.01); *H01L 31/048* (2013.01); *H01L 31/0684* (2013.01); *H01L 31/18* (2013.01); *Y02E 10/50* (2013.01)

(58) Field of Classification Search
CPC ......... H01L 31/0684; H01L 31/0224–022458; H01L 31/05–0516
See application file for complete search history.

(56) References Cited

U.S. PATENT DOCUMENTS 4,328,390 A * 5/1982 Meakin ........... H01L 31/022425
136/256
4,521,640 A * 6/1985 Levine ............ H01L 31/035281
136/250

(Continued)

FOREIGN PATENT DOCUMENTS

CN 103928563 7/2014

OTHER PUBLICATIONS

Definition of "foil" [retrieved from https://www.collinsdictionary.com/dictionary/english/foil on Aug. 19, 2019].*

*Primary Examiner* — Eric R Smith
(74) *Attorney, Agent, or Firm* — Schwabe, Williamson & Wyatt, P.C.

(57) ABSTRACT

A solar cell and a solar laminate are described. The solar cell can have a front side which faces the sun during normal operation and a back side opposite front side. The solar cell can include conductive contacts having substantially reflective outer regions disposed on the back side of the solar cell. The solar laminate can include a first encapsulant, the first encapsulant disposed on the back side of the solar cell and a second encapsulant. The solar laminate can include the solar cell laminated between the first and second encapsulant. The substantially reflective outer regions of the conductive contacts and the first encapsulant can be configured to scatter and/or diffuse light at the back side of the solar laminate for substantial light collection at the back side of the solar cell. Methods of fabricating the solar cell are also described herein.

6 Claims, 8 Drawing Sheets

(56) References Cited

U.S. PATENT DOCUMENTS

| | | | | |
|---|---|---|---|---|
| 6,172,296 | B1* | 1/2001 | Iwasaki | H01L 31/02168 136/256 |
| 2008/0006911 | A1* | 1/2008 | Nakahara | C25D 3/46 257/645 |
| 2009/0242013 | A1* | 10/2009 | Taguchi | H01L 31/022425 136/246 |
| 2009/0255569 | A1* | 10/2009 | Sampsell | H01L 31/022425 136/246 |
| 2010/0096002 | A1* | 4/2010 | Hayashi | H01B 1/22 136/252 |
| 2011/0005568 | A1* | 1/2011 | Kim | H01L 31/0236 136/244 |
| 2011/0041911 | A1* | 2/2011 | Lee | H01L 31/0236 136/256 |
| 2011/0277817 | A1* | 11/2011 | Ide | H01L 31/022441 136/246 |
| 2012/0060911 | A1* | 3/2012 | Fu | H01L 31/022425 136/256 |
| 2012/0103408 | A1* | 5/2012 | Moslehi | H01L 31/0516 136/256 |
| 2012/0247554 | A1* | 10/2012 | Wootton | H01L 31/0508 136/256 |
| 2013/0340804 | A1* | 12/2013 | Moon | H01L 31/0516 136/244 |
| 2014/0124027 | A1* | 5/2014 | Teshima | H01L 31/0508 136/256 |
| 2014/0190545 | A1 | 7/2014 | Lei et al. | |
| 2015/0068596 | A1* | 3/2015 | Ibara | H01L 31/022433 136/256 |
| 2017/0062633 | A1* | 3/2017 | Carlson | H01L 31/022441 |

\* cited by examiner

BIFACIAL SOLAR CELLS WITH REFLECTIVE BACK CONTACTS

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Efficiency is an important characteristic of a solar cell as it is directly related to the capability of the solar cell to generate power. Likewise, efficiency in producing solar cells is directly related to the cost effectiveness of such solar cells. In an example, bifacial solar cells can collect light from both a front and a back side of the solar cell, and thus can increase the overall solar cell efficiency. In one example, a bifacial PV module can include the bifacial solar cells to collect light from both a front and a back side of the PV module. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
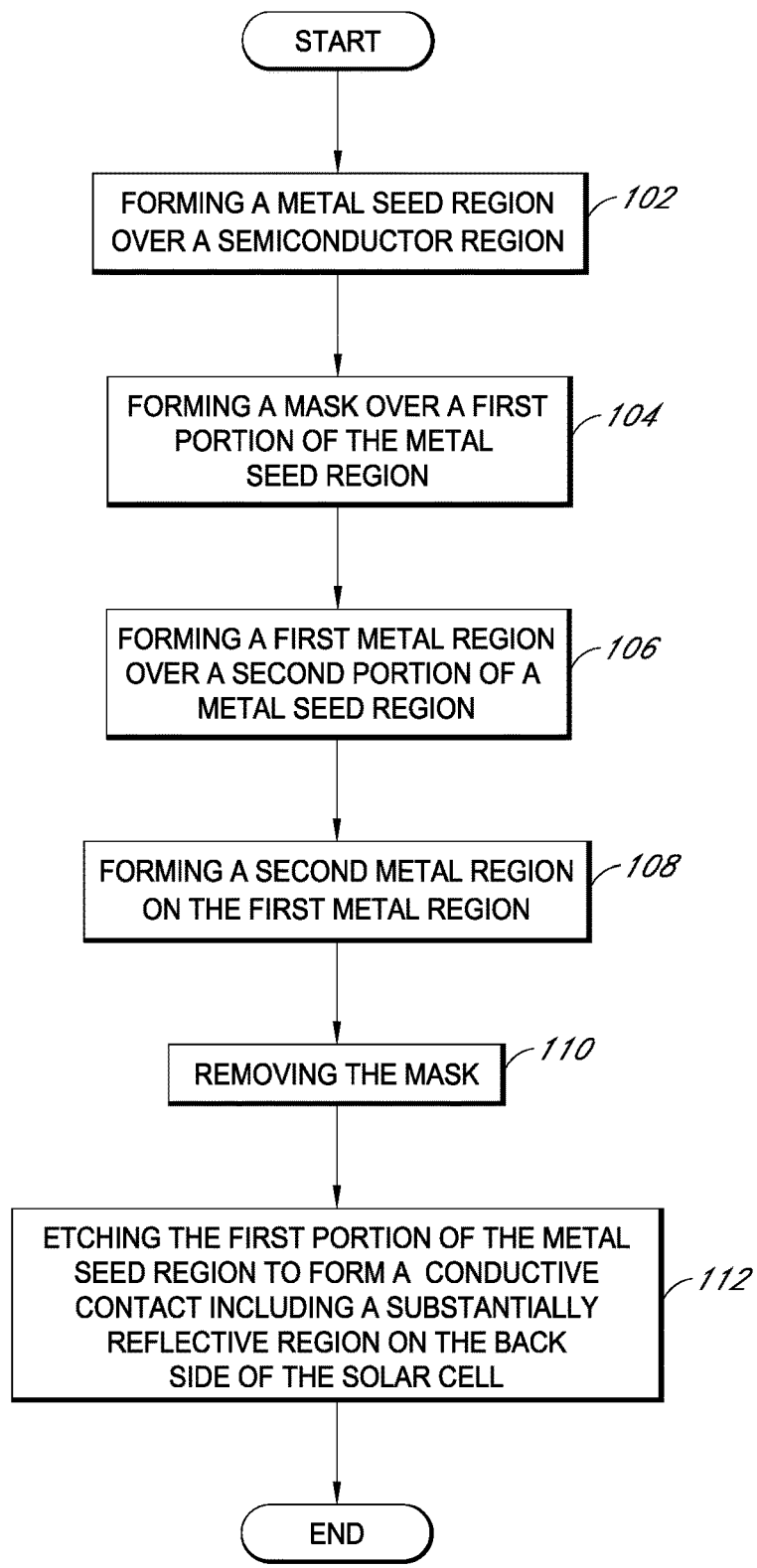
FIG. 1 illustrates a flow chart representation of an example method for fabricating a solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" metal region does not necessarily imply that this metal region is the first metal region in a sequence; instead the term "first" is used to differentiate this metal region from another metal region (e.g., a "second" metal region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification includes a description of an example method for fabricating a solar cell, followed by example solar cells formed from the described methods. In various embodiments, the solar cell can be a single-crystalline solar cell or a multi-crystalline solar cell and can be a back-contact solar cell or a front-contact solar cell. In an embodiment, the solar cell can be a bifacial solar cell. In an example, a bifacial solar cell is a solar cell configured to collect light from both a front and a back side of the solar cell. In an embodiment, a bifacial solar cell can provide additional efficiency and power in comparison to a non-bifacial solar cell. In one example, the solar cell can be included in a solar laminate. Various examples are provided throughout.

Turning now to FIG. 1, a method for fabricating a solar cell is shown, according to some embodiments. In various embodiments, the method of FIG. 1 can include additional (or fewer) blocks than illustrated. For example, in some embodiments, a mask need not be formed at block 104 and subsequently removed at block 110.

Figure 2:
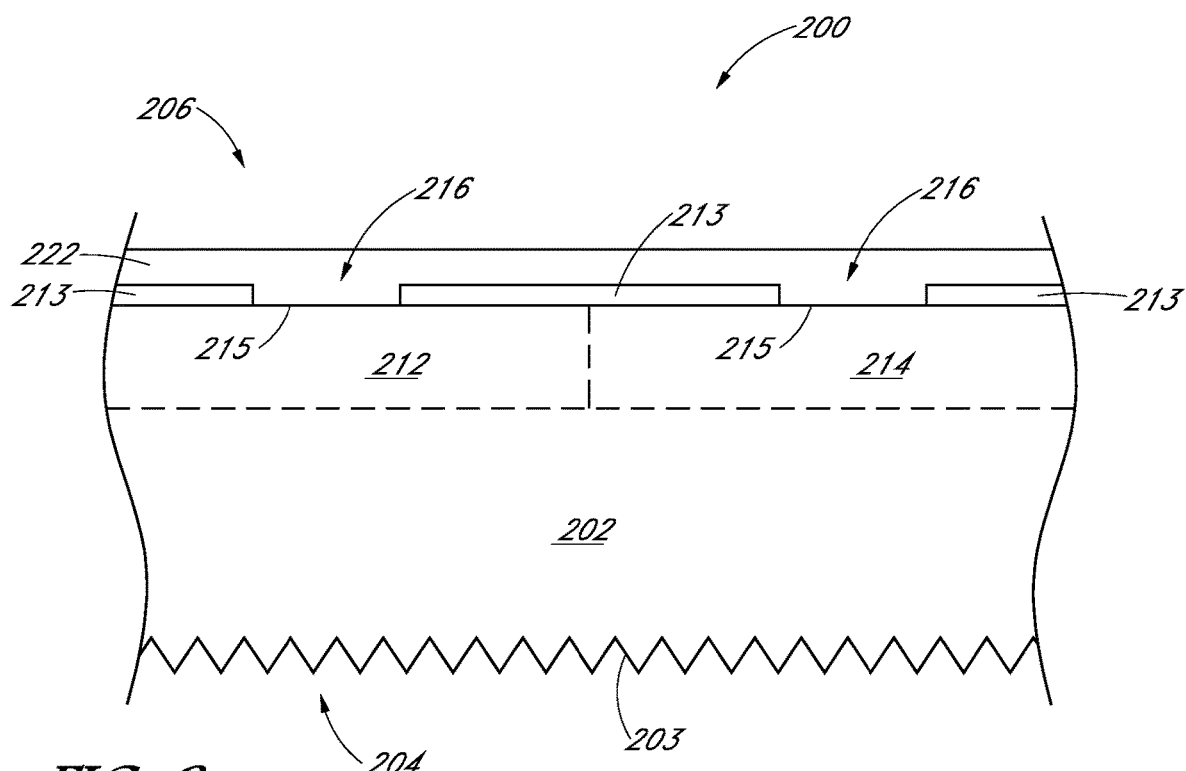
FIGS. 2-6 illustrate cross-sectional views of an example solar cell during the method of FIG. 1, according to some embodiments.

Referring to FIG. 2, and corresponding operation 102 of the flowchart of FIG. 1, a metal seed region 222 can be formed over a surface 215 of the solar cell 200, according to some embodiments. In an embodiment, the solar cell 200 can include a substrate 202. In an embodiment, the solar cell 200 can have a front side 204 which faces the sun during normal operation and a back side 206 opposite the front side 204.

In an embodiment, a dielectric region 213 can be formed over the surface 215 of the substrate 202, as shown. In an embodiment, the dielectric region 213 can include silicon oxide and/or other oxides. In an embodiment, a contact opening 216 can be formed in the dielectric region 213 as shown and, as a result, the metal seed region 222 can be formed on the surface 215 of the substrate 202 within the contact opening 216. In an example, the contact opening 216 can be formed by laser ablation and/or by a mask and etch process, among others.

In an embodiment, the substrate 202 can be a silicon substrate. In some embodiments, the silicon substrate can be cleaned, polished, planarized and/or thinned or otherwise processed prior to the formation of the metal seed region 222. In an embodiment, the silicon substrate can be single-crystalline or a multi-crystalline silicon substrate. In an embodiment, the silicon substrate can be an N-type or a P-type silicon substrate.

In an embodiment, prior to the formation of the metal seed region 222, a semiconductor region can be formed in or above the substrate 202. In an example, a first semiconductor region 212 can include an N-type doped region. In one example, a second semiconductor region 214 can include a P-type doped region. In an embodiment, the first and second semiconductor regions 212, 214 can be in the substrate 202.

In an embodiment, the first and second semiconductor regions 212, 214 can be formed over the substrate 202. In an example, the first and second semiconductor regions 212, 214 can be doped polysilicon regions. In an embodiment, the doped polysilicon regions can be formed over the substrate. In one embodiment, a dielectric region (e.g., a tunnel oxide) can be formed between the doped polysilicon regions and the substrate.

In an embodiment, the metal seed region 222 can include aluminum (e.g., an aluminum region), aluminum/Si, nickel, copper, titanium, tungsten, and/or alloys thereof, among other examples. In an embodiment, the metal seed region 222 can be formed by blanket deposition, by printing techniques (e.g., screen printing, ink jet printing and/or spin coating), among other examples.

In an embodiment, the front side 204 of the solar cell 200 can be a textured surface 203 as shown in FIG. 2. In an embodiment, a hydroxide-based wet etchant can be used to form at least a portion of the textured surface 203 and/or to texturize exposed portions of the substrate 202. A textured surface may be one which has a regular or an irregular shaped surface. In an example, a regular shaped surface can be a smooth and/or planarized surface. In one example, an irregular shaped surface can be a rough, uneven, and/or a non-planar surface. In an embodiment, the textured surface 203 at the front side 204 of the solar cell 200 can be configured to scatter incoming light, where the light scattered from the front side 204 of the solar cell 200 can decrease the amount of light reflected off of the front side 204 and, thus, increase the light collected at the front side 204 of the solar cell 200.

Figure 3:
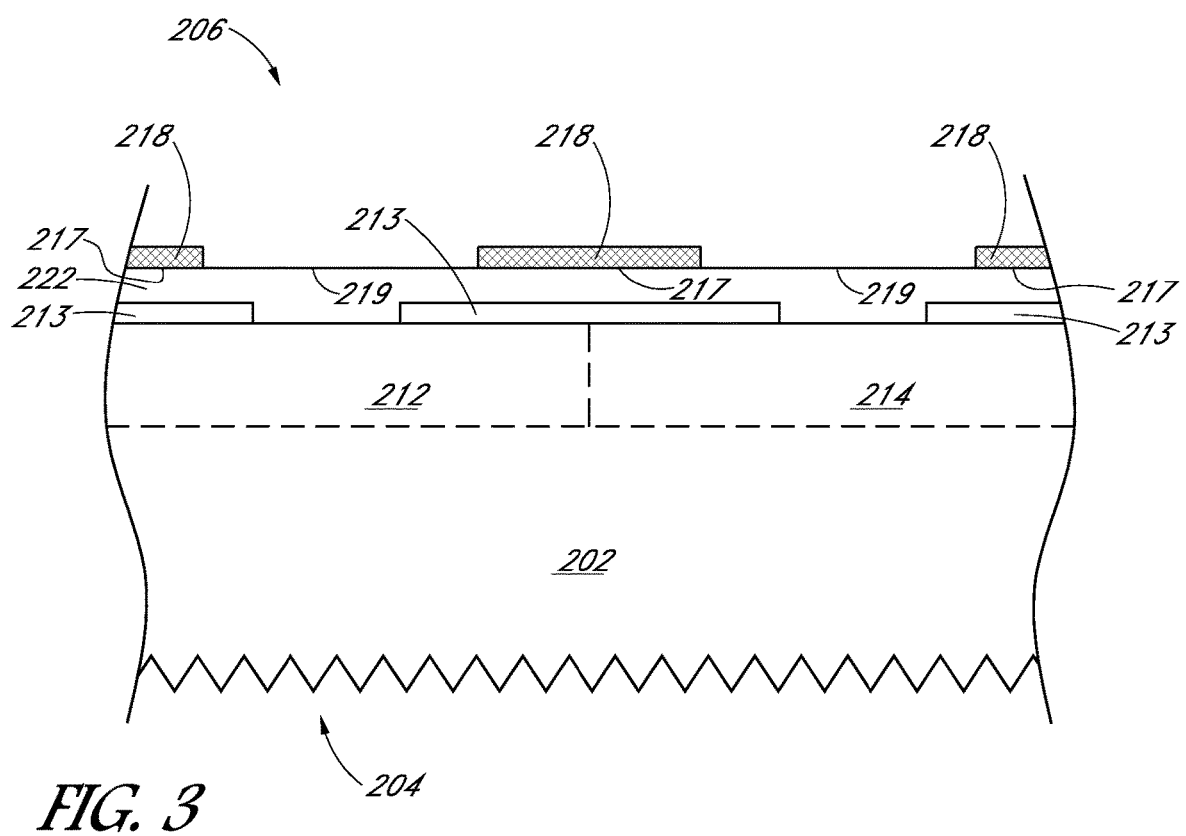

FIG. 3, and corresponding operation 104 of the flowchart of FIG. 1, illustrates forming a mask 218 over a first portion 217 of a metal seed region 222, according to some embodiments. In an embodiment, the mask 218 can be an ink, e.g., an etch resist ink. In an embodiment, printing techniques, including screen printing, ink jet printing and/or spin coating, among other examples, can be used to deposit the mask 218 over the first portion 217 of the metal seed region 222. In an embodiment, a second portion 219 of the metal seed region 222 can be exposed, e.g., not have any ink over that portion.

Figure 4:
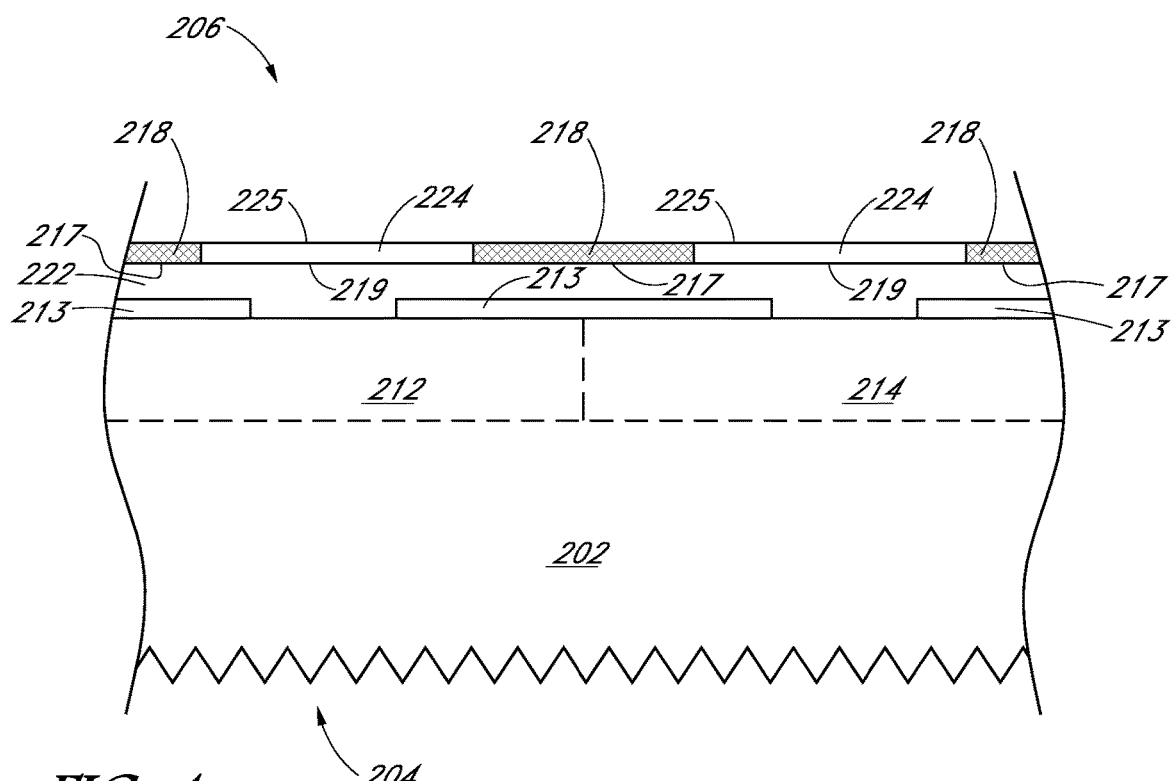

Referring to FIG. 4, and corresponding operation 106 of the flowchart of FIG. 1, a first metal region 224 can be formed over the second portion 219 of the metal seed region 222, according to some embodiments. In an embodiment, the first metal region 224 can include copper, nickel (e.g., a copper or nickel region), and/or alloys thereof, among other examples. In an embodiment, the first metal region 224 can be formed with a plating process. In an embodiment, the first metal region 224 can be plated directly to the second portion 219 of the metal seed region 222. In an embodiment, a surface 225 of the first metal region 224 can be textured. A textured surface may be one which has a regular or an irregular shaped surface. In an example, an irregular shaped surface can be a rough, uneven, and/or a non-planar surface. In an embodiment, the first metal region 224 can have a thickness of 5 um-100 um. In an embodiment, the mask 218 can inhibit plating of the first metal 224 to the first portion 217 of the metal seed region 222, as shown in FIG. 4.

Figure 5:
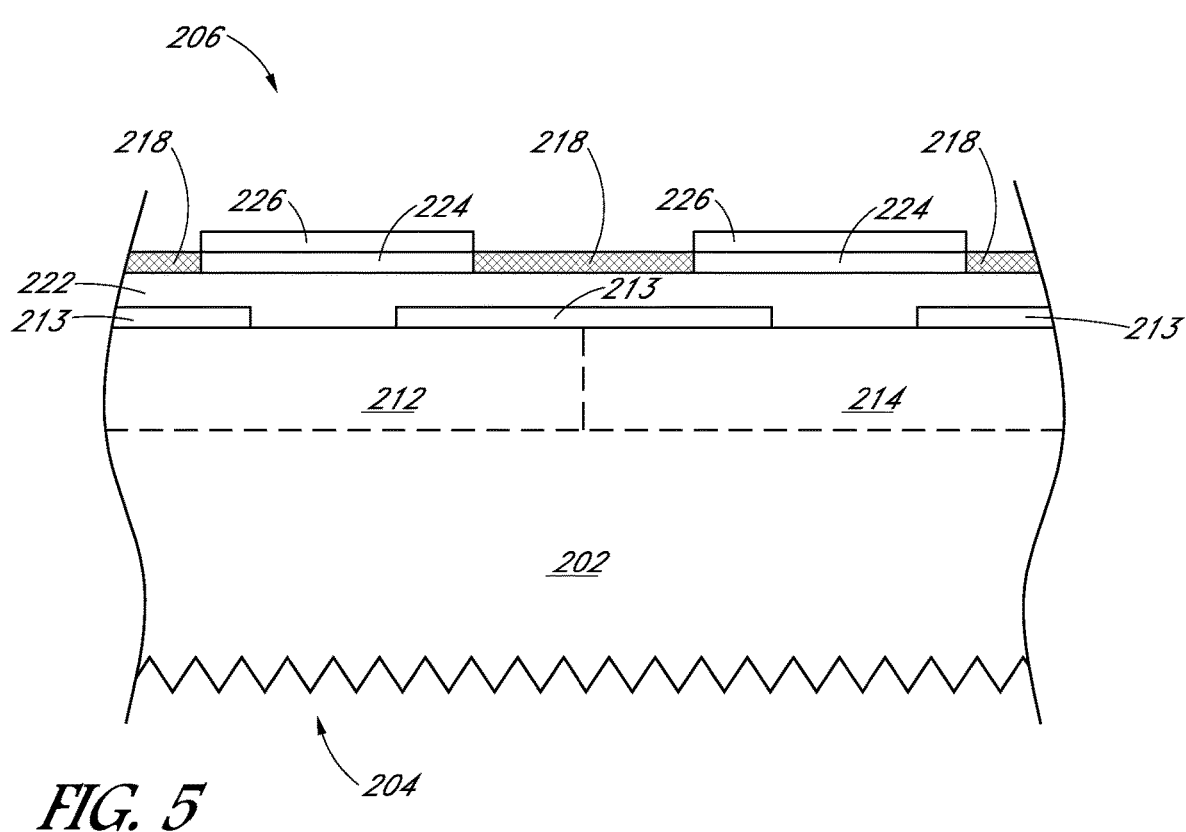

Referring to FIG. 5, and corresponding operation 108 of the flowchart of FIG. 1, a second metal region 226 can be formed on the first metal region 224. In an embodiment, an immersion coating, electrodeposition and/or plating process can be used to form the second metal region 226 on the first metal region 224. In an example, an immersion coating processing can be used to coat the second metal region 226 having a thickness of at most 2 μm onto the first metal region 224. In an embodiment, an electrodeposition process and/or plating process can be performed to from the second metal region 226 having a thickness of greater than 2 μm onto the first metal region 224.

In an embodiment, the second metal region 226 can be substantially reflective. Reflectance, e.g., total reflectance, is made up of a scattered and specular component of reflected light. In an example, scattered light can include light reflected at various angles from a surface of a medium in contrast to specular light which can be reflected in a single direction (e.g., reflected directly back as in a mirror). A substantially reflective region can be a region having a reflectance made up by greater than 50% scattered reflectance component. In one example, the substantially reflective region can include a substantially reflective metal. In a specific example, silver is a substantially reflective metal having a greater than 50% scattered reflectance component. As described herein, reflectance can be referred to as total reflectance (e.g., combined scattered and specular reflected light). A substantially reflective region can be a region having a greater than 75% total reflectance. Specifically, a substantially reflective region can be a region having a greater than 75% total reflectance for wavelengths greater than or equal to approximately 450 nm. In one example, silver or bright tin are metals having a greater than 75% total reflectance at wavelengths greater than or equal to approximately 450 nm. As used herein, substantially reflective region can also be referred to as a substantially reflective outer region. In an embodiment, the second metal region 226 can include a conductive metal (e.g., capable of conducting electricity). In an example, the second metal region 226 can include a conductive metal such as silver, gold, among others.

Figure 6:
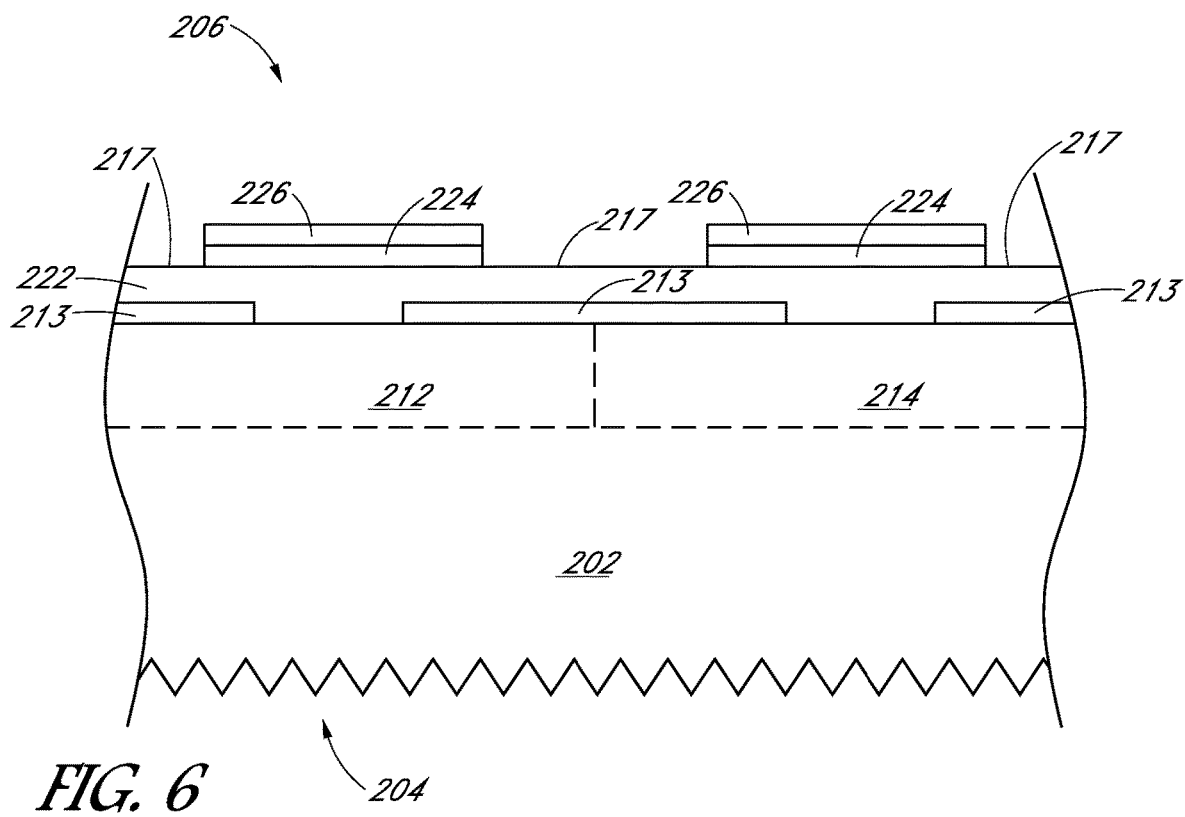

FIG. 6, and corresponding operation 110 of the flowchart of FIG. 1, illustrates removing the mask 218 of FIGS. 3-5, according to some embodiments. In an embodiment, an ink strip process can be performed to remove the mask 218 of FIGS. 3-5. In an embodiment, after removing the mask 218, the first portion 217 of the metal seed region 222 can be exposed, e.g., not have any ink over that portion.

Figure 7:
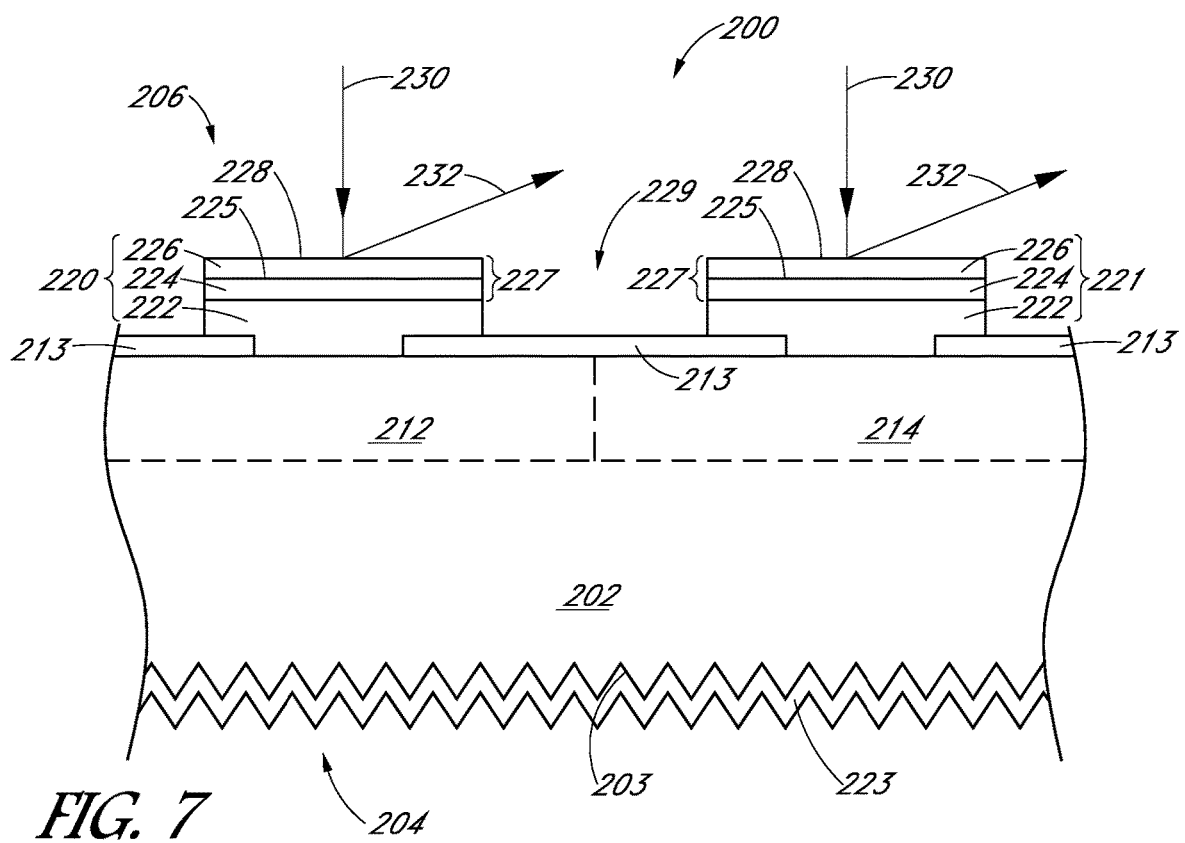
FIGS. 7 and 8 illustrate example solar cells, according to some embodiments.

Referring to FIG. 7, and corresponding operation 112 of the flowchart of FIG. 1, the first portion 217 of the metal seed region 222 of FIG. 6 can be etched to form conductive contacts 220, 221 on the substrate 202, according to some embodiments. In an example, a first conductive contact 220 can be formed over the first semiconductor region 212. In one example, a second conductive contact 221 can be formed over the second semiconductor region 214. In an embodiment, the conductive contacts 220, 221 can include a metal seed region 222, first metal region 224 and second metal region 226. In one embodiment, the conductive contacts 220, 221 can form metal contact fingers. In an embodiment, the metal contact fingers can be interdigitated. In some embodiments, the conductive contacts 220, 221 can cover less than approximately 80% of a total surface area of the back side 206 of the solar cell 200.

In an embodiment, the etching can include at least partially etching the second metal region 226, where the second metal region 226 can inhibit etching, at block 112, of the first metal region 224. In one embodiment, the etching process described can texturize a surface 228 of the second metal region 226. A textured surface may be one which has a regular or an irregular shaped surface for scattering incoming light 230. In an example, the etching process described can texturize the second metal region 226 to form a rough, uneven and/or irregular shaped surface 228 on the second metal region 226. In an embodiment, the surface 228 of the second metal region 226 can be configured to scatter and/or diffuse incoming light 230 (e.g., reflect light 232 at multiple angles) at the back side 206 of the solar cell 200. In an embodiment, the second metal region and/or the surface of the first metal region can be referred to as a substantially reflective outer region 227.

In some embodiments, the second metal region 226 can be formed after the etching process (e.g., block 108 can be performed after block 112). In one example, an immersion coating, electrodeposition and/or plating process can be used to form the second metal region 226 on the first metal region 224 subsequent to the etching process. In an example, an immersion coating processing can be used to coat the second metal region 226 having a thickness of at most 2 μm onto the first metal region 224. In an example, a silver coating, among other coatings (e.g., gold coating), can be formed on the first metal region 224. In an embodiment, an electrodeposition process and/or plating process can be performed to from the second metal region 226 having a thickness of greater than 2 μm onto the first metal region 224. In an example, bright tin, among other metals (e.g., bright copper), can be formed by electrodeposition and/or a plating process on the first metal region 224.

Referring to FIGS. 1-7, in some embodiments, the mask 218 need not be formed. In an example, a patterned metal seed region can be formed (e.g., as an alternative process to a mask and etch process) over the surface 215 of the solar cell 200, according to some embodiments, where the first metal region 224 can be formed directly on the patterned metal seed region. In an embodiment, the first metal region 224 can be formed on the patterned metal seed region by bonding and/or welding process.

With reference to FIGS. 1-7, in some embodiments, the second metal region need not be formed. In an embodiment, the first metal region 224 can be a metal foil (e.g., an aluminum foil). In an embodiment, a surface of the metal foil can have a matte finish. In an embodiment, the surface of the metal foil can be configured to scatter and/or diffuse incoming light (e.g., reflect light at multiple angles) at the back side of the solar cell.

Figure 8:
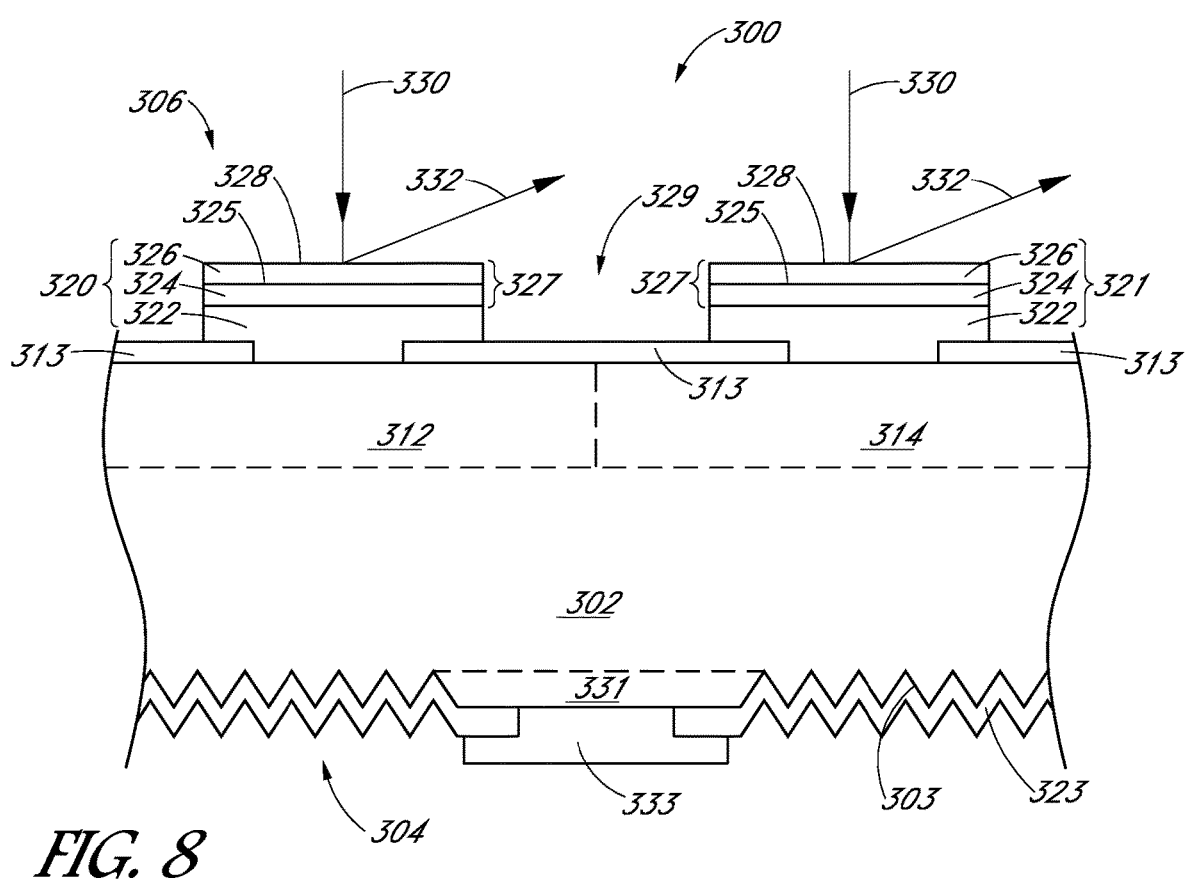
Figure 9:
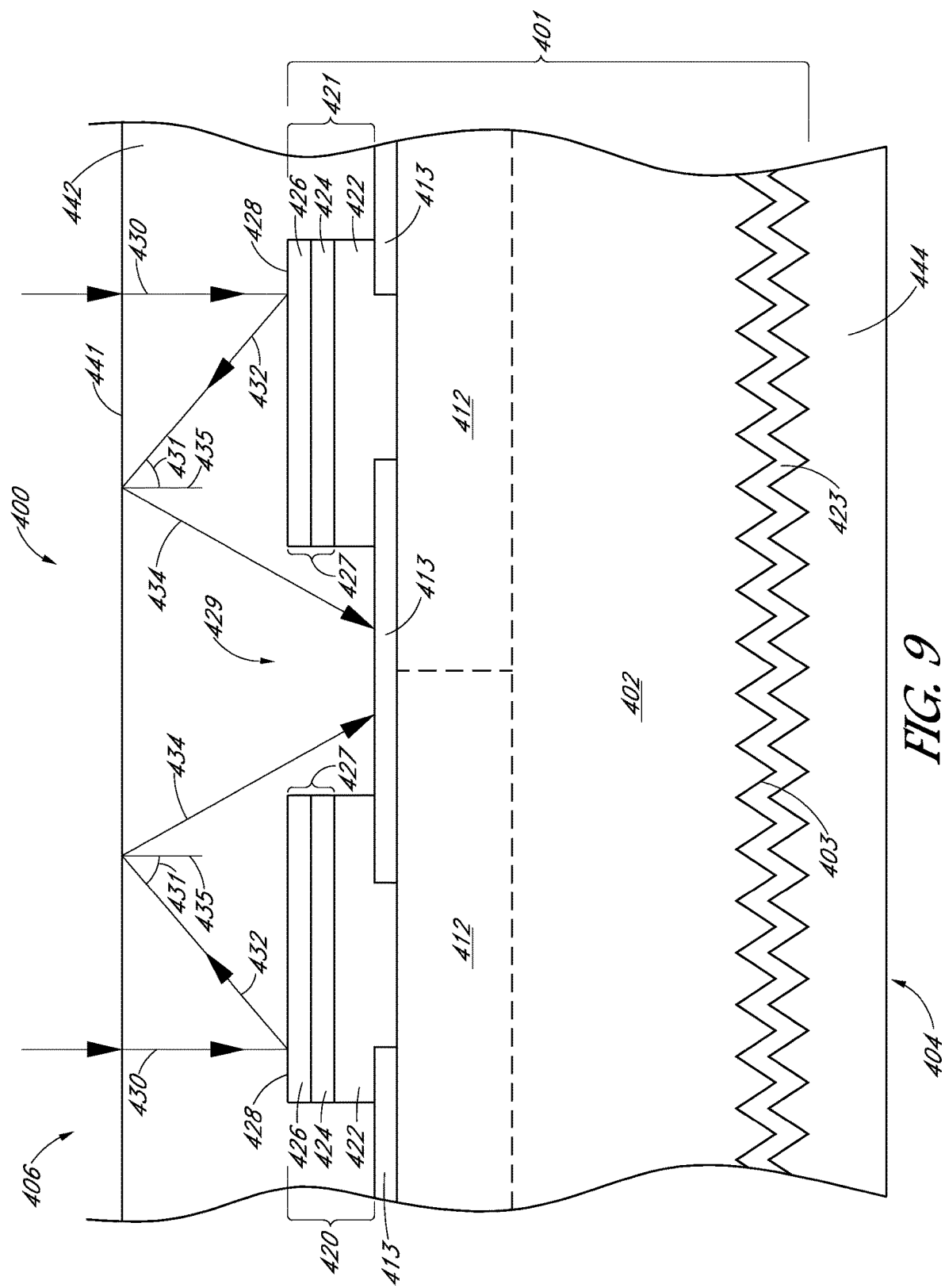
FIG. 9 illustrates an example solar laminate, according to some embodiments.

Structures which can improve solar collection for a photovoltaic (PV) module can be beneficial to increase the overall power output of the PV module. In an example, PV modules (e.g., bifacial PV modules) which include the solar cells formed from the methods of FIGS. 1-7 can have at least approximately 10% increase in efficiency in comparison to other PV modules. In a specific example, solar cells formed from the methods of FIGS. 1-7 can be configured to reflect light at angles that provide for substantial total internal reflection (TIR) between an encapsulant at the back side of the PV module and a back side of the solar cell, thus substantially increasing collected light at the back side of the solar cell. FIGS. 7 and 8 provide for specific examples of solar cells formed from the methods presented above. FIG. 9 presents an example solar laminate including the solar cells of FIGS. 7 and 8, where the solar laminate can be combined with a frame to form a PV module.

FIG. 7 illustrates an example solar cell formed from the methods described above, according to some embodiments. As shown, the solar cell 200 can have a front side 204 which faces the sun during normal operation and a back side 206 opposite the front side 204. In an embodiment, the solar cell 200 can be a bifacial solar cell. A bifacial solar cell can be a solar cell configured to collect light from the front and back side 204, 206 of the solar cell 200.

In an embodiment, the front side 204 of the solar cell 200 can have a textured surface 203 as shown in FIG. 7. A textured surface may be one which has a regular or an irregular shaped surface. In an example, a regular shaped surface can be a smooth and/or planarized surface. In one example, an irregular shaped surface can be a rough, uneven, and/or a non-planar surface. In an embodiment, the textured surface 203 at the front side 204 of the solar cell 200 can be configured to scatter incoming light, where the light scattered from the front side 204 of the solar cell 200 can decrease the amount of light reflected off of the front side 204 and, thus, increase the light collected at the front side 204 of the solar cell 200. In an embodiment, a front dielectric region 223 can be formed over the surface 203. In some embodiments, the front dielectric region 223 can include silicon oxide, among other oxides.

In an embodiment, the solar cell 200 can include a substrate 202. In an embodiment, the substrate 202 can be a silicon substrate. In some embodiments, the silicon substrate can be single-crystalline or a multi-crystalline silicon substrate. In one embodiment, the silicon substrate can be an N-type or a P-type silicon substrate.

In an embodiment, the substrate 202 can include a semiconductor region 212, 214 on the back side 206 of the solar cell 200. In an example, a first semiconductor region 212 can include an N-type doped region. In one example, a second semiconductor region 214 can include a P-type doped region. In an embodiment, the first and second semiconductor regions 212, 214 can be in the substrate 202. In an embodiment, the first and second semiconductor regions 212, 214 can be disposed over the substrate 202. In an example, the first and second semiconductor regions 212, 214 can be doped polysilicon regions. In an embodiment, the doped polysilicon regions can be disposed over the substrate 202 at the back side 206 of the solar cell 200. In one embodiment, a dielectric region (e.g., a tunnel oxide) can be disposed between the doped polysilicon regions and the substrate.

In an embodiment, conductive contacts 220, 221 can be disposed on the semiconductor regions 212, 214 at the back side 206 of the solar cell 200. In an example, a first conductive contact 220 can be disposed over the first semiconductor region 212. In one example, a second conductive contact 221 can be disposed over the second semiconductor region 214. In an embodiment, the conductive contacts 220, 221 allow for pathways for electrical current conduction from the first and second semiconductor regions 212, 214 to an external circuit. In some embodiments, the conductive contacts 220, 221 can include a metal seed region 222. In an embodiment, a dielectric region 213 can be disposed between the metal seed region 222 and the substrate 202, as shown. In one embodiment, the dielectric region 213 can include silicon oxide, among other oxides. In an embodiment, the metal seed region 222 can include aluminum (e.g., an aluminum region), aluminum/Si, nickel, copper, titanium, tungsten, and/or alloys thereof.

In an embodiment, the conductive contact 220, 221 can include a first metal region 224. In one embodiment, the first metal region 224 can be disposed on the metal seed region 222, as shown. In an embodiment, the first metal region 224 can include copper, nickel (e.g., a copper or nickel region), and/or alloys thereof. In an embodiment, the first metal region 224 can have a thickness approximately in the range of 5-100 μm. In some embodiments, a surface 225 of the first metal region 224 can be textured. A textured surface may be one which has a regular or an irregular shaped surface. In one embodiment, the first metal region 224 can include a plated metal (e.g., formed by a plating process).

In an embodiment, the conductive contacts 220, 221 can include a second metal region 226 disposed on the first metal region 224.

In an embodiment, the second metal region 226 can be substantially reflective. Reflectance, e.g., total reflectance, is made up of a scattered and specular component of reflected light. In an example, scattered light can include light reflected at various angles from a surface of a medium in contrast to specular light which can be reflected in a single direction (e.g., reflected directly back as in a mirror). A substantially reflective region can be a region having a reflectance made up by greater than 50% scattered reflectance component. In one example, the substantially reflective region can include a substantially reflective metal. In a specific example, silver is a substantially reflective metal having a greater than 50% scattered reflectance component. As described herein, reflectance can be referred to as total reflectance (e.g., combined scattered and specular reflected light). A substantially reflective region can be a region having a greater than 75% total reflectance. Specifically, a substantially reflective region can be a region having a greater than 75% total reflectance for wavelengths greater than or equal to approximately 450 nm. In one example, silver or bright tin are metals having a greater than 75% total reflectance at wavelengths greater than or equal to approximately 450 nm. As used herein, a substantially reflective region can also be referred to as a substantially reflective outer region. In an embodiment, the second metal region 226 can include a conductive metal (e.g., capable of conducting electricity). In an example, the second metal region 226 can include a conductive metal such as silver, gold, among others In one embodiment, the second metal region 226 can coat the surface 225 of the first metal region 224. In an example, the second metal region 226 can have a thickness of at most 2 μm. In one example, silver can be used to coat the surface of the first metal region 224. In an embodiment, the surface 225 can be textured. In one example, bright tin can be used to coat the textured surface of the first metal region 224. In some embodiments, the second metal region 226 can include a plated metal. In the same embodiment, the second metal region 226 can have a thickness greater than 2 μm. In an embodiment, a surface 228 of the second metal region 226 can be textured (e.g., uneven, irregular, not smooth or non-planar). In an example, a surface 228 of second metal region 226 can have a matte finish. In some embodiments, the surface 225 of the first metal region 224 and/or the second metal region 226 can be referred to as a substantially reflective outer region 227. In an example, both the surface 225 of the first metal region 224 and the second metal region 226 can be configured to substantially scatter and/or diffuse incoming light at the back side 206 of the solar cell 200.

Note that although the second metal region 226 is described as a metal region, in some embodiments, region 226 can include a non-metal region, such as an organic solder protective coating (OSP), a polymer film, among other materials. In some embodiments, the polymer film can include titanium oxide or barium sulfate (e.g., as pigments). In an embodiment, the polymer film can have a thickness of 0.5-10 μm. In an embodiment, the region 228 can have greater than approximately 75% reflectance.

In some embodiments, the conductive contacts 220, 221 can be metal contact fingers. In one embodiment, the conductive contacts 220, 221 can be interdigitated metal contact fingers. In an embodiment, the conductive contacts 220, 221 can cover less than approximately 80% of a total surface area of the back side 206 of the solar cell 200.

In an embodiment, a separation region 229 can separate conductive contacts 220, 221 of different polarity (e.g., a positive and a negative contact contacts 220, 221) from contacting. In some embodiments, the separation region 229 can include a trench region, where the trench region can be a partially etched region of the silicon substrate (e.g., substrate 202). In some embodiments, the trench region can be configured to absorb light from the back side 206 of the solar cell 200.

In an embodiment, the conductive contacts 220, 221 need not include a second metal region. In an example, the first metal region 224 (e.g., without the second metal region 226) can include a metal foil (e.g., an aluminum foil). In one embodiment, the metal foil and the surface of the metal foil can be substantially reflective (e.g., configured to scatter and/or diffuse light at the back side 206 of the solar cell 200).

With reference to FIG. 8, an example solar cell is shown, according to some embodiments. As shown, the solar cell of FIG. 8 has similar reference numbers to elements of FIG. 7, wherein like reference numbers refer to similar elements throughout the figures.

FIG. 8 illustrates an example solar cell formed from the methods described above, according to some embodiments. In an embodiment, the solar cell of FIG. 8 can be a front contact solar cell. As shown, the solar cell 300 can have a front side 304 which faces the sun during normal operation and a back side 306 opposite the front side 304. In an embodiment, the solar cell 300 can be a bifacial solar cell. A bifacial solar cell can be a solar cell configured to collect light from the front and back side 304, 306 of the solar cell 300.

In an embodiment, the structure of FIG. 8 is substantially similar to the structure of FIG. 7 except as described below. Therefore the description of corresponding portions of FIG. 7 applies equally to the description of FIG. 8.

In an embodiment, another semiconductor region 331 can be located on the front side 304 of a solar cell 300. In an example, the semiconductor region 331 can include an N-type or P-type doped region. In an embodiment, the semiconductor region 331 can be formed at the front side 304 of the solar cell 300. In an embodiment, the semiconductor region 331 can be disposed on the front side 304 of the solar cell 300, as shown. In an example, the semiconductor region 331 can be a doped polysilicon region. In an embodiment, a dielectric region (e.g., a tunnel oxide) can be disposed between the doped polysilicon region and the substrate 202.

In an embodiment, another conductive contact 333 can be disposed on the semiconductor region 331 on the front side 304 of the solar cell 300. In an embodiment, the conductive contact 333 can allow for a pathway for electrical current conduction from the semiconductor region 331 to an external circuit.

As shown, according to some embodiments, the solar cell 300 of FIG. 8 can be a front contact solar cell. The solar cell 300 can include conductive contacts 320, 321 having a substantially reflective outer region 327 on the back side 306 of the solar cell 300. In an embodiment, the substantially reflective outer region 327 on the back side 306 can be configured to scatter and/or diffuse light 330 (e.g., reflect light 332 at multiple angles) at the back side 306 of the solar cell 300.

With reference to FIG. 9, an example solar laminate is shown, according to some embodiments. In an embodiment, the solar laminate 400 can include a solar cell 401. In one embodiment, the solar cell 401 of FIG. 9 is substantially similar to the solar cell of FIGS. 7 and 8. As shown, the solar cell 401 has similar reference numbers to elements of the solar cells of FIGS. 7 and 8, wherein like reference numbers refer to similar elements throughout the figures. In an embodiment, the structure of the solar cell 401 is substantially similar to the structure of the solar cell in FIGS. 7 and/or FIG. 8, respectively, except as described below. In an example, the solar cell 401 can include conductive contacts 420, 421 having a substantially reflective outer region 427 which are substantially similar to the conductive contacts 220, 221, 320, 321 and substantially reflective outer regions 227, 327 of FIGS. 7 and 8, respectively. Also, in one embodiment, the solar cell 401 can have another conductive contact located the front side 404 of FIG. 9 similar to the conductive contact 333 on the front side 304 of FIG. 8. Therefore the description of corresponding portions of FIG. 7 and/or FIG. 8 applies equally to the description of the solar cell 401 of FIG. 9. In an embodiment, the solar cell 401 (e.g., of FIGS. 7 and 8) can be laminated between a first and second encapsulant 442, 444 to form the solar laminate 400. In an embodiment, the first encapsulant 442 can be disposed on the back side 406 of the solar cell 401. In one embodiment, the first encapsulant 442 can be substantially transparent. In an example, the first encapsulant can have an index of refraction approximately in the range of 1.45-1.5.

In an embodiment, the first encapsulant 442 can be configured to allow light 430 from an external source to be transmitted through the first encapsulant 442 to the back side 406 of the solar cell 401. In an embodiment, the substantially reflective outer region 427 of the conductive contacts 420, 421 can be configured to reflect the light 432 to the first encapsulant 442 at angles 431 which allow for substantial total internal reflection (TIR) between the first encapsulant 442 and the back side 406 of the solar cell, thus substantially increasing collected light at the back side of the solar cell 401. Note that TIR requires an angle of incidence for light on a surface to be greater than a critical angle which is defined by Snell's Law. In an example, a critical angle can be computed using Snell's Law from arcsin (index 1/index 2), where index 2 is the medium in which light originates, and index 1 is the medium adjacent to index 2.

Referring to FIG. 9, reflected light 432 from the substantially reflective outer region 427 can be incident to a surface 441 of the first encapsulant 442 at an angle 431. If the angle 431 is greater than a critical angle from a normal line 435 (e.g., a line normal to the surface 441), the reflected light 432 can be further reflected back 434 from the surface 441 to the back side 406 of the solar cell 401 for additional light collection. In one example, where the first encapsulant 442 has an index of refraction of approximately 1.45 and the adjacent medium is air (index of refraction approximately 1), the critical angle can be 43.6 degrees from the normal 435 to a first encapsulant's surface 441. Light incident on the surface 441 of first encapsulant 442 at an angle less than 43.6 degrees can be lost and/or transmitted out of the first encapsulant 442. Thus, in one embodiment, the substantially reflective outer region 227 can be configured to scatter and/or diffuse light 432 to the first encapsulant 442 at an angle 431 which is greater than or equal to a critical angle from a normal line 435 to the surface 441 and light can be reflected 434 from the surface 441 of first encapsulant 442 (e.g., by TIR) to be collected at the back side 406 of the solar cell 401. In an embodiment, the light can be reflected 434 from first encapsulant 442 at an angle approximately equal to the angle 431.

In an example, the substantially reflective outer region 427 of the conductive contacts 420, 421 can include silver, gold, among other metals. In some examples, the substantially reflective outer region 427 can be formed by immersion coating, electrodeposition and/or plating process. In an embodiment, the substantially reflective outer region 427 can include an immersion coated metal 426 having a thickness of at most 2 μm. In an example, the substantially reflective outer region 427 can include a silver and/or gold coated region. In an embodiment, the substantially reflective outer region 427 can include a plated metal 226 having a thickness of greater than 2 μm. In an example, the substantially reflective outer region 427 can include a plated bright tin or bright copper.

In an embodiment, the solar laminate 400 including the solar cell 401 having a substantially reflective outer region 427 at the back side of the solar cell (e.g., formed from the techniques of FIGS. 1-7) can have an approximately greater than 10% bifacial efficiency improvement in comparison to another solar laminate including a solar cell without a conductive contact having a substantially reflective outer region (e.g., either the first and second metal region or combination thereof being substantially reflective) at the back side of the solar cell.

In an embodiment, the front side 404 of the solar cell 401 can be disposed on a second encapsulant 444. In one embodiment, the second encapsulant 442 can be substantially transparent. In an example, the second encapsulant can have an index of refraction approximately in the range of 1.45-1.5. In an embodiment, the solar cell 401 can be laminated between the first and second encapsulant 442, 444. In an example, another solar cell or a plurality of solar cells (e.g., any one of the solar cells of FIGS. 7 and 8) can be laminated between the first and second encapsulant 442, 444.

In an embodiment, the solar laminate 400 can be included in a photovoltaic (PV) module. In an example, a PV module can include a frame mounted to the solar laminate 400, where the frame can be configured to provide structural support to the solar laminate.

Figure 10:
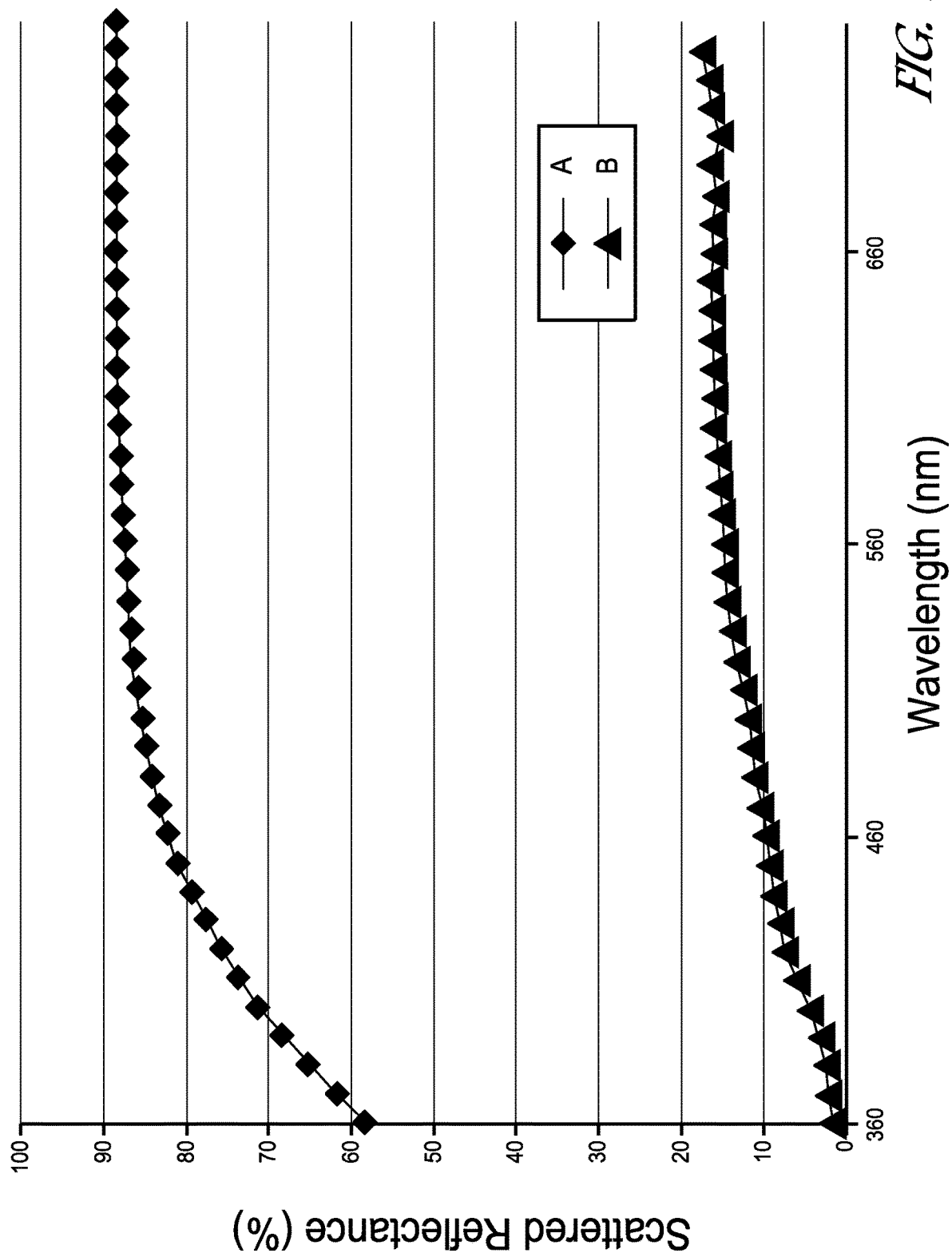
FIG. 10 illustrates a graph of scattered reflectance versus wavelength for example metals, according to some embodiments.

With reference to FIG. 10, a graph of scattered reflectance versus wavelength for example metals A and B is shown, according to some embodiments. As shown, the metal A is silver and the metal B is bright tin. As discussed above in FIG. 7, reflectance, e.g., total reflectance, is made up of a scattered and specular component of reflected light. As shown, silver is an example of a substantially reflective metal having a greater than 50% scattered reflectance. Also as shown, the scattered reflectance for silver is substantially greater than bright tin over a wide range of wavelengths.

Figure 11:
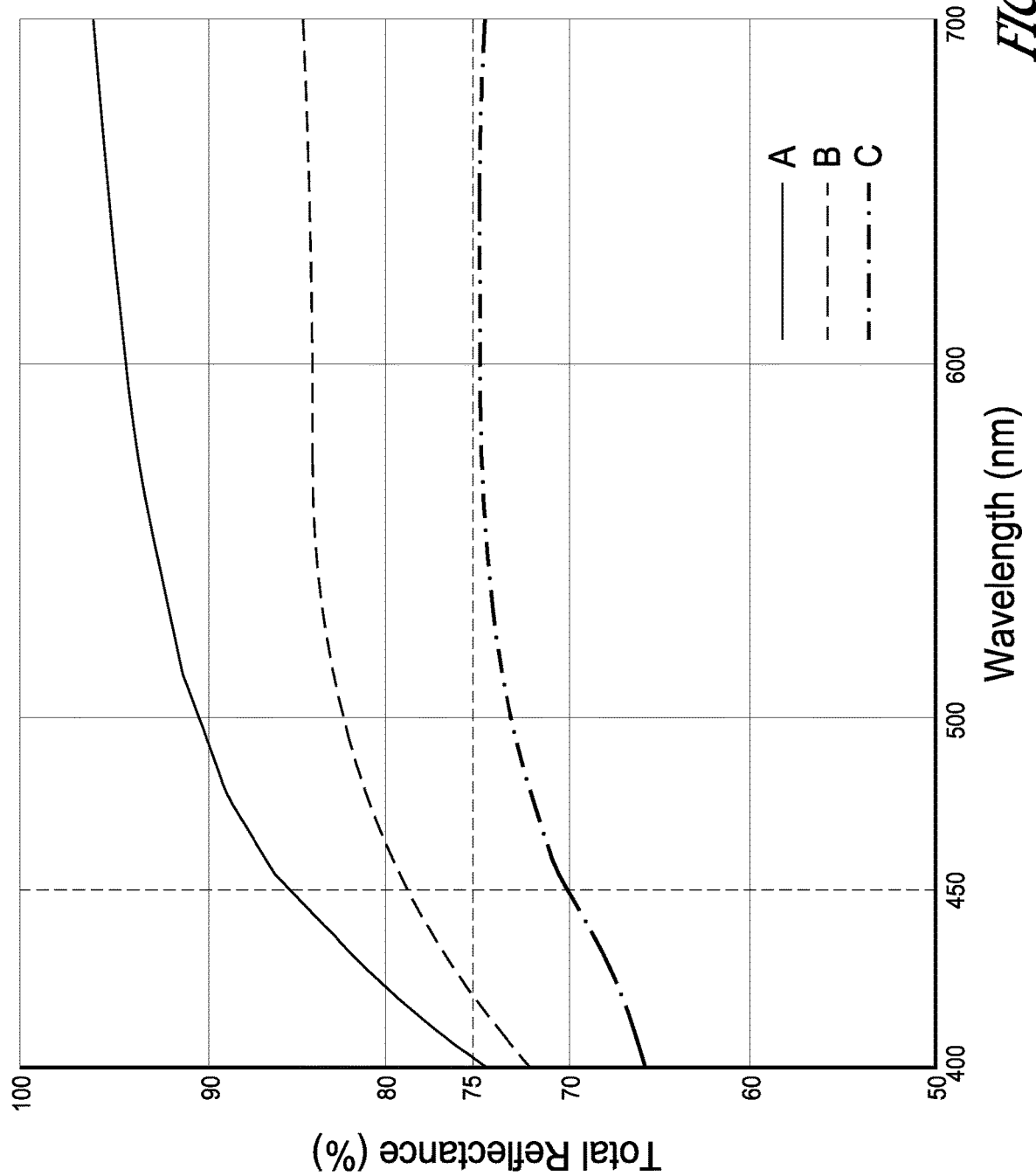
FIG. 11 illustrates a graph of total reflectance versus wavelength for example metals, according to some embodiments.

FIG. 11 illustrates a graph of total reflectance versus wavelength for example metals A, B and C is shown. As shown, the total reflectance comprises the sum of scattered and specular reflectance components. As shown, the metal A is silver, the metal B is bright tin and the metal C is matte tin. As shown, silver and bright tin are examples of substantially reflective metals having a greater than approximately 75% total reflectance at approximately 450 nm wavelengths or more. As shown, silver and bright tin have a substantially greater total reflectance versus matte tin.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, the solar cell having a front side which faces the sun during normal operation and a back side opposite the front side, the solar cell comprising:
   a first semiconductor region disposed in a substrate, wherein the first semiconductor region is located on the back side of the solar cell and has a lateral width less than a lateral width of the substrate; and
   a first conductive contact comprising a substantially reflective outer region disposed over the first semiconductor region, wherein the substantially reflective outer region of the first conductive contact has an upper surface and a lower surface, and wherein an entirety of the lower surface is substantially flat, wherein the substantially reflective outer region has a lateral width that does not change in a direction perpendicular to the upper surface and the lower surface, wherein the first conductive contact has a widest lateral width less than the lateral width of the first semiconductor region, and wherein the substantially reflective outer region comprises an aluminum foil having an exposed matte finish, the exposed matte finish facing away from the first semiconductor region, wherein the widest lateral width is the width of the substantially reflective outer region.

2. The solar cell of claim 1, further comprising:
   a second semiconductor region located on the front side of the solar cell; and
   a second conductive contact disposed on the second semiconductor region.

3. The solar cell of claim 1, further comprising:
   a second semiconductor region disposed in or above the substrate, wherein the second semiconductor region is located on the back side of the solar cell; and
   a second conductive contact comprising a substantially reflective outer region disposed on the second semiconductor region.

4. A solar cell, the solar cell having a front side which faces the sun during normal operation and a back side opposite the front side, the solar cell comprising:
   a first semiconductor region disposed in a substrate, wherein the first semiconductor region is located on the back side of the solar cell and has a lateral width less than a lateral width of the substrate; and
   a first conductive contact comprising a substantially reflective outer region disposed over the first semiconductor region, wherein the substantially reflective outer region of the first conductive contact has an upper surface and a lower surface, and wherein an entirety of the lower surface is substantially flat, wherein the substantially reflective outer region has a lateral width that does not change in a direction perpendicular to the upper range and the lower surface, wherein the first conductive contact has a widest lateral width less than the lateral width of the first semiconductor region, and wherein the substantially reflective outer region comprises a metal foil having an exposed matte finish, the exposed matte finish facing away from the first semiconductor region, wherein the widest lateral width is the width of the substantially reflective outer region.

5. The solar cell of claim 4, further comprising:
a second semiconductor region located on the front side of the solar cell; and
a second conductive contact disposed on the second semiconductor region.

6. The solar cell of claim 4, further comprising:
a second semiconductor region disposed in or above the substrate, wherein the second semiconductor region is located on the back side of the solar cell; and
a second conductive contact comprising a substantially reflective outer region disposed on the second semiconductor region.

* * * * *